(12) United States Patent
Bright et al.

(10) Patent No.: US 8,718,732 B2
(45) Date of Patent: May 6, 2014

(54) SUPERCONDUCTOR SWITCHING ARRANGEMENT

(75) Inventors: Christopher G Bright, Nottingham (GB); Adam J McLoughlin, Derby (GB)

(73) Assignee: Rolls-Royce PLC, London (GB)

( * ) Notice: Subject to any disclaimer, the term of this patent is extended or adjusted under 35 U.S.C. 154(b) by 0 days.

(21) Appl. No.: 13/618,792

(22) Filed: Sep. 14, 2012

(65) Prior Publication Data

US 2013/0096008 A1   Apr. 18, 2013

(30) Foreign Application Priority Data

Oct. 13, 2011   (GB) .................................. 1117689.8

(51) Int. Cl.
*H01L 39/24* (2006.01)
(52) U.S. Cl.
USPC .......................................................... 505/211
(58) Field of Classification Search
USPC .............................. 505/211, 850, 867; 307/112
See application file for complete search history.

(56) References Cited

U.S. PATENT DOCUMENTS

| | | | |
|---|---|---|---|
| 2010/0176755 A1* | 7/2010 | Hoadley et al. | 318/105 |
| 2011/0026170 A1* | 2/2011 | Husband et al. | 361/19 |

FOREIGN PATENT DOCUMENTS

| | | |
|---|---|---|
| JP | A-03-123111 | 5/1991 |
| WO | WO 2008/119045 A1 | 10/2008 |
| WO | WO 2009/122124 A1 | 10/2009 |
| WO | WO 2009/157532 A1 | 12/2009 |

OTHER PUBLICATIONS

Feb. 28, 2012 Search Report issued in British Patent Application No. 1117689.8.

* cited by examiner

*Primary Examiner* — Colleen Dunn
(74) *Attorney, Agent, or Firm* — Oliff PLC

(57) ABSTRACT

The invention relates to a superconductor switching arrangement, including: a superconductor having a plurality of first connection zones and at least one second connection zone, the first and second connection zones being connectable by at least one superconducting path in use, a quenching device which is operable to selectively quench portions of the superconductor so as to remove the superconducting path between at least two of the first connection zones and the at least one second connection zone.

20 Claims, 10 Drawing Sheets

SUPERCONDUCTOR SWITCHING ARRANGEMENT

TECHNICAL FIELD OF INVENTION

This invention relates to a superconductor switching arrangement. In particular, though not exclusively, this invention relates to a superconducting switching arrangement for rectifying and inverting alternating and direct currents. It also relates to a switching arrangement for use in a transformer and as a fault current limiter.

BACKGROUND OF INVENTION

Conventional state of the art propulsion systems for large civil aircraft typically include one or more gas turbine engines placed under the wings of the aircraft. However, some studies have indicated that so-called distributed propulsion, which involves having numerous smaller propulsion units preferentially arranged around an aircraft, may provide some significant benefits in terms of noise reduction and fuel efficiency when compared with the current state of the art technology.

One option for a distributed propulsion system is to have numerous electrically powered fan units located around the aircraft. However, early studies by the applicant have indicated that novel electrical technology will be required to implement such a distributed electrical system.

One such technology is the creation of a superconducting system to provide the electrical power to the fan units so as to try and reduce the weight of the electrical system.

The concept of using a superconductor for providing electrical power is well known. A superconductor conducts electricity without loss, that is, with zero electrical resistance. In order to be superconducting, current state of the art superconductor materials must be maintained below a critical temperature, current density and magnetic field. If any of the critical limits are exceeded then the superconductor is said to "quench", at which point it reverts to its "normal" electrical (and magnetic) properties.

In the case of ceramic superconductors the quenched electrical resistance can be very high. Hence, it is possible, and known, to provide a switch where an applied magnetic field is used to control the superconducting state of a superconductor and thus switch it between operating points having high and low (zero) resistance.

FIG. 1 shows the basic concept for a cryotron 10 which uses an electrical coil 12 wrapped around a length of superconductor 14. The superconductor current, Ig, flows until an electrical current, Ic, of sufficient magnitude to produce a quenching magnetic field flows through the electrical coil 12. Once this occurs, the resistance increases until there is negligible current flow, thereby providing a switch.

The present invention seeks to provide a superconducting switch of general application but which may preferably be used in a distributed propulsion system of an aircraft.

STATEMENTS OF INVENTION

In a first aspect, the present invention provides a superconductor switching arrangement, comprising: a superconductor having a plurality of first connection zones and at least one second connection zones, the first and second connection zones being connectable by at least one superconducting path in use, a quenching device which is operable to selectively quench regions of the superconductor so as to remove the superconducting path between at least two of the first connection zones and the at least one second connection zone.

Having a superconducting path which can be switched between two of first connections zones allows a sliding superconducting path to be passed across the superconductor and helps avoid power dissipation which may occur if each region was switched off discretely.

The quenching device may include at least one magnetic flux source configured to provide a critical magnetic field to the superconductor.

The quenching device may further comprise at least one electromagnetic coil which is switchable to modify the magnetic field provided to the superconductor in use.

The quenching device may be arranged so as to provide a conductive path between two adjacent first connection zones and a second connection zone.

The electromagnetic coil may include a superconductor.

The quenching device may be configurable to provide a superconducting path between at least two of the plurality of first connection zones.

The superconductor may be a monolithic homogeneous body.

The superconductor switching arrangement may further comprise dielectric barriers between each of the plurality of first connection zones.

The superconducting body may be cylindrical.

The quenching device may be configured to provide a radial magnetic field. The quenching device may be configured to provide an axial magnetic field.

The quenching device may include at least one poly phase winding which is configured to provide a rotating magnetic field in use.

The superconducting switching arrangement may have at least two second connection zones connected to a direct current electrical load or source, The superconductor switching arrangement may have at least three first connection zones, each of the first connection zones being connected to a single phase of a three phase alternating current electrical circuit.

At least one of the single phases is connected to at least two of the first connection zones.

The superconductor switching arrangement may further comprise a heater for selectively heating portions of the superconductor body.

The superconductor switching arrangement may further comprise a network of passageways within the superconducting body, wherein the network of passageways is configurable such that a flow of fluid can be selectively controlled so as to quench or cool portions of the superconducting body.

In a second aspect, the present invention provides a power convertor having a plurality of superconductor switching arrangements according to the first aspect.

In the power convertor, the second connection zones of each superconducting switching arrangement may be connected together via a direct current link.

The superconductor switching arrangement may further comprise a transformer winding, wherein each of the plurality of first connection zones connects to a different electrical portion of the winding.

In a third aspect, the present invention may provide a method of switching between electrical connection zones of a superconductor switching arrangement which comprises: a superconductor having a plurality of first connection zones and at least one second connection zones, the first and second zones being connectable by a superconducting path in use, a quenching device which is operable to selectively quench portions of the superconductor so as to remove the superconducting path between at least one of the first connection zones and the at least one second connection zone, the method comprising the steps of: connecting at least one first electrical circuit to the plurality of first connection zones; connecting at least one second electrical circuit to the at least one second connection zone; putting the superconductor into a superconducting state; quenching at least one region of the superconductor with the quenching device so as to quench the superconducting device between at least one of the first connection zones and the at least one second connection zone.

The method may further comprise quenching the superconductor so as to provide a superconductive path between at least two first connection zones and the second connection zone.

DESCRIPTION OF DRAWINGS

Embodiments of the invention are described below with the aid of the following drawings in which.

DETAILED DESCRIPTION OF INVENTION

Figure 5:
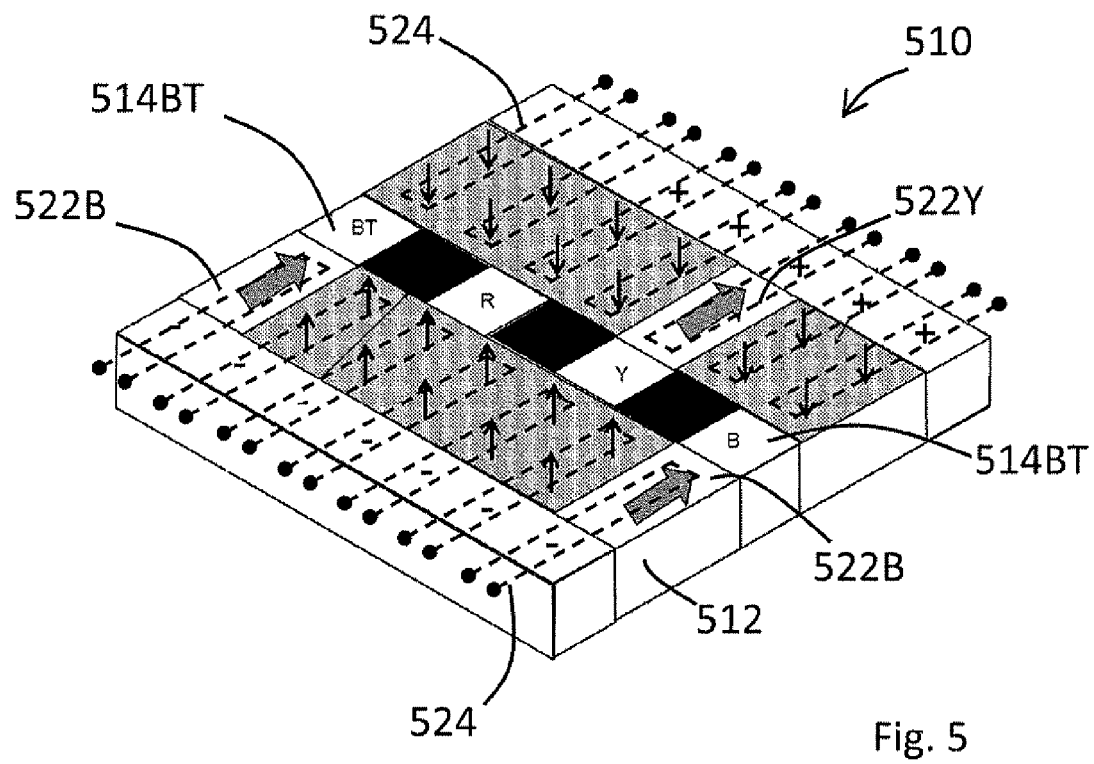
FIG. 5 shows an alternative superconductor switch arrangement.
Figure 1:
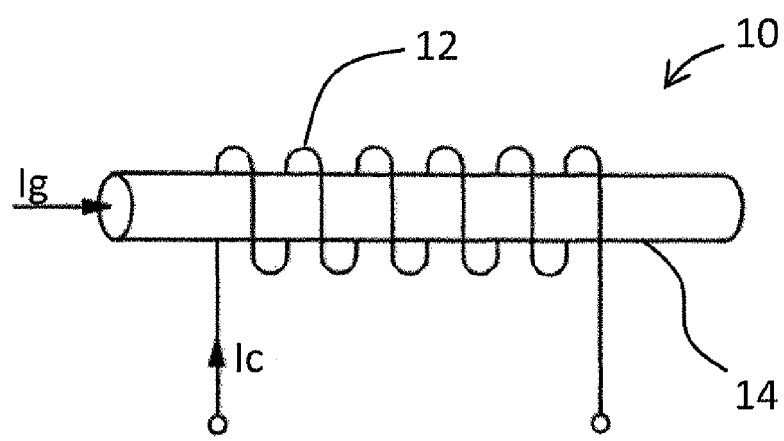
FIG. 1 shows the aforementioned known superconducting switch arrangement.

FIG. 2 shows the superconductor switching arrangement 210 according to the present invention. The superconductor switching arrangement 210 includes a body 212 of superconducting material, a plurality of first connection zones 214 R, Y, B and a plurality of second connection zones 216.

The superconductor body 212 is a monolith of homogenous superconductor material in the form of a rectangular plate. The superconductor body 212 of the embodiment is made by a known process of filling a mould with a constituent powder and sintering it. In the case of YBCO, the powder would be a mixture of carbonates of yttrium, copper and barium well mixed and in stochiometric ratios. During sintering the heat applied to carbonates will convert the carbonates to oxides and form YBCO. A plate of magnesium diboride could be made in a similar way by sintering a well mixed powdered magnesium and boron in a stochiometric ratio.

The properties of the superconductor body 212 are not restrictive and can be any known type which is suitable as per requirements of the described embodiments. For example, the superconductor may be Bismuth Strontium Calcium Copper Oxide (BSCCO), Yttrium Barium Copper Oxide (YBCO) or Magnesium Diboride ($MgB_2$). As will be appreciated, these materials need to be provided with the environment to achieve a superconducting state. For example, the device may be placed within a cryostat with adequate cooling and thermal insulation etc. The cryostat and thermal insulation is not shown for the sake of clarity. Further, some applications will require the superconducting switching arrangement to be electrically, magnetically and thermally shielded.

The plurality of first connection zones 214 includes three separate connection points R, Y, B provided in a linear arrangement across a shorter mid-line of the superconducting body 212. The first connection zones 214 extends across the entirety of the superconducting body 212 with a connection zone R, B provided at corresponding positions on opposing sides thereof. Each of the connection zones R, Y, B is separated from the adjacent zone via a dielectric barrier in the form of a block of electrical insulation 218 which abuts the connection zones R, Y, B on either side.

The electrical insulation 218 may be any known type which could be incorporated into the superconducting body 212. A suitable insulator is aluminium oxide which has both good thermal and good electrical properties. Dielectric barriers may be formed by providing apertures in the superconducting plate and inserting alumina. The alumina may be introduced as a solid or a powder at the start of the sintering process which is used to form the superconductor body 212 described above. The alumina in solid or powdered form would be inserted into the required positions in the powder prior to sintering. It will be appreciated that, in the case of inserting solid blocks of alumina, the sintering process would take place at a temperature below the melting point of alumina. In an alternative embodiment, the apertures are vacant and a fluid such as air, gas or an insulating cryogen such as liquid nitrogen is used to occupy and insulate the apertures.

There are two second connection zones 216 which are provided on the opposing end portions of the superconducting body 212 and which run parallel to the first connection zones 214.

The switch arrangement 210 is shown in an operational state and as such each of the plurality of first connection zones 214 is connected to a single phase R, Y, B (namely one of red, yellow, blue) of a three-phase circuit and each of the second connections zones 216 is connected to a respective rail of a direct current, D.C., circuit.

It will be appreciated that the electrical connection to the superconductor body 212 can be made in any suitable way. Thus, the connections zones 214, 216 may represent terminals which receive conductors or some other electrical junction. The electrical circuits referred to can be loads or sources of electrical power. In the described embodiment, the three phase electrical circuit is a supply which is converted to DC using the superconductor switching arrangement 210.

Figure 6A:
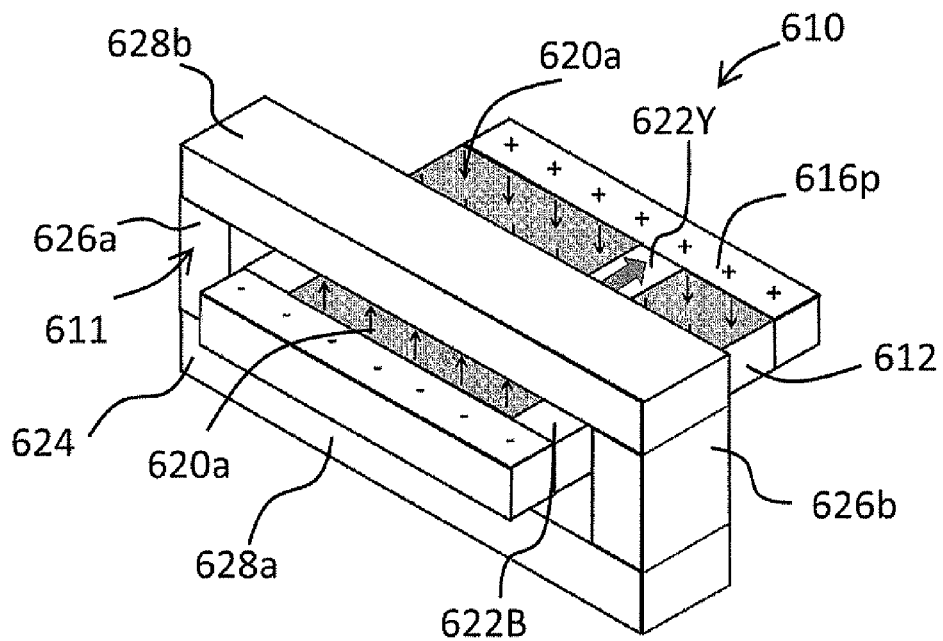
FIGS. 6a and 6b show a schematic superconductor switching arrangement having a quenching device from a perspective view and a cross-sectional view, respectively.
Figure 6B:
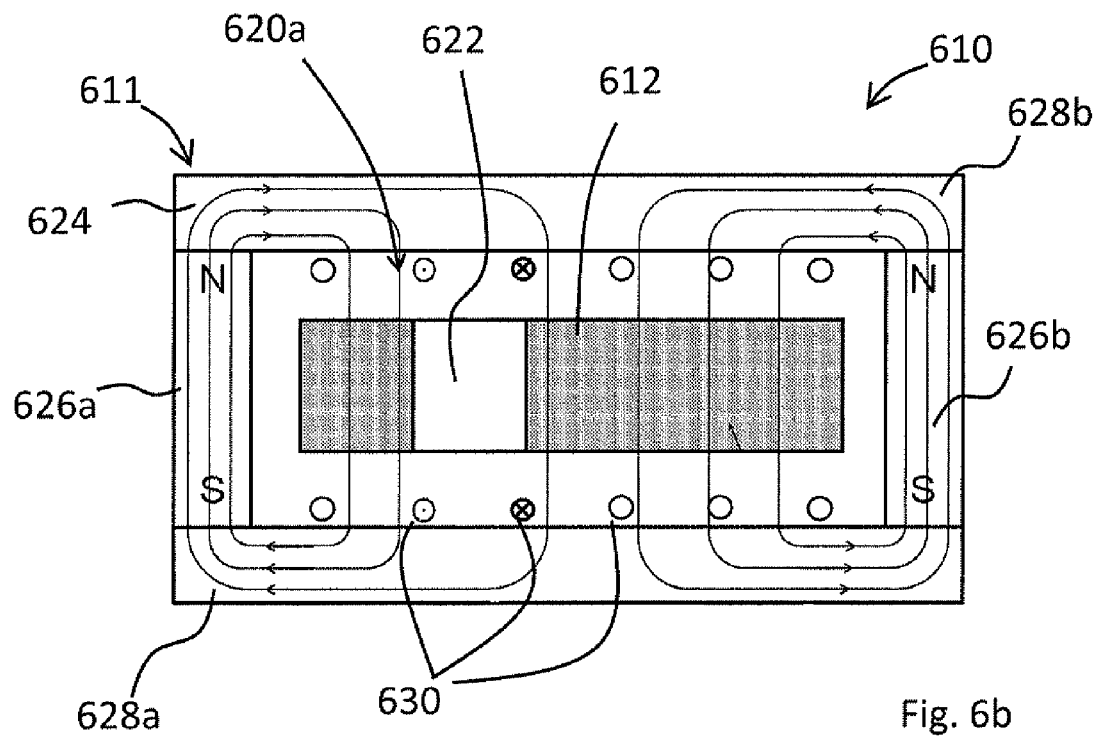

A magnetic field 220 is provided perpendicular to the plane the rectangular superconductor body 212 (as indicated by arrows 220a and 220b) by a quenching device (as shown in FIGS. 6a and 6b and described later) which is operable to create a magnetic field of sufficient strength and distribution to selectively quench portions of the superconductor body 212. Hence, in this way, portions of the superconductor 212 can be quenched and returned to a high resistive state, thereby removing the superconducting path. Thus, it is possible to isolate between the phases of the first connection zones 214 which are connected to the electrical supply and also between the first connection zones 214 and the second connection zones, as required to perform a switching task.

Figure 2A:
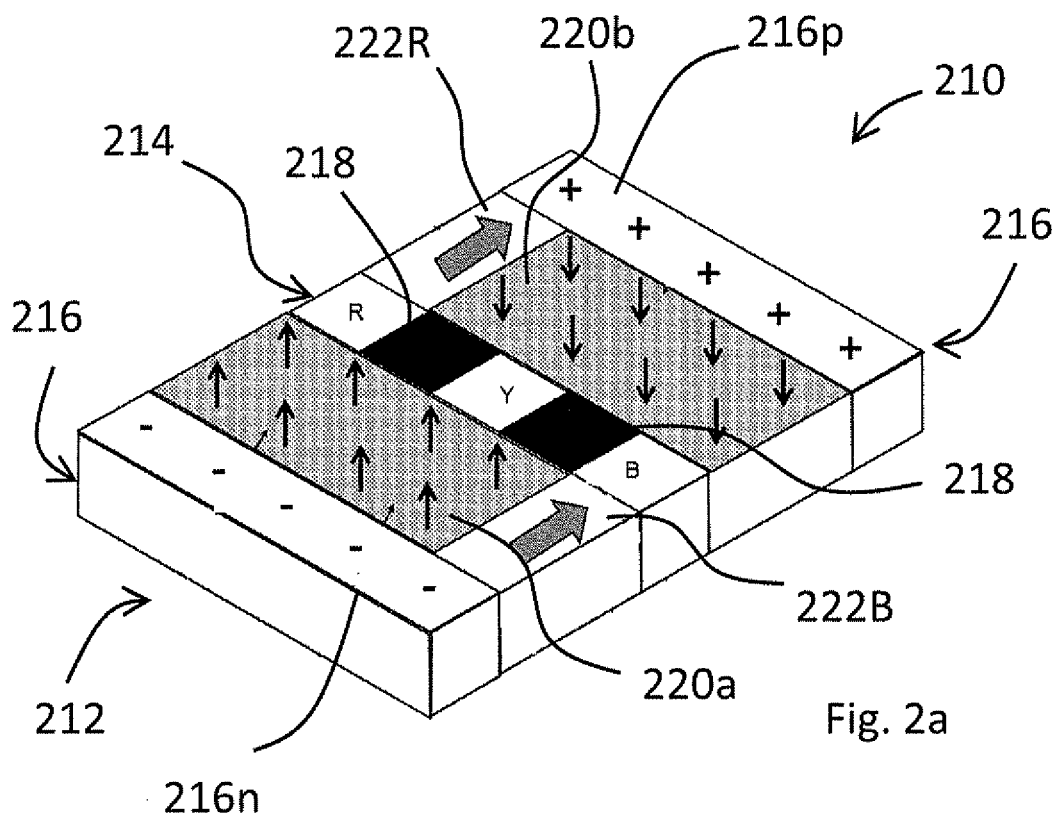
FIGS. 2a and 2b show a schematic representation of a superconducting switch arrangement and corresponding voltage waveform at time $t_1$ respectively.
Figure 2B:
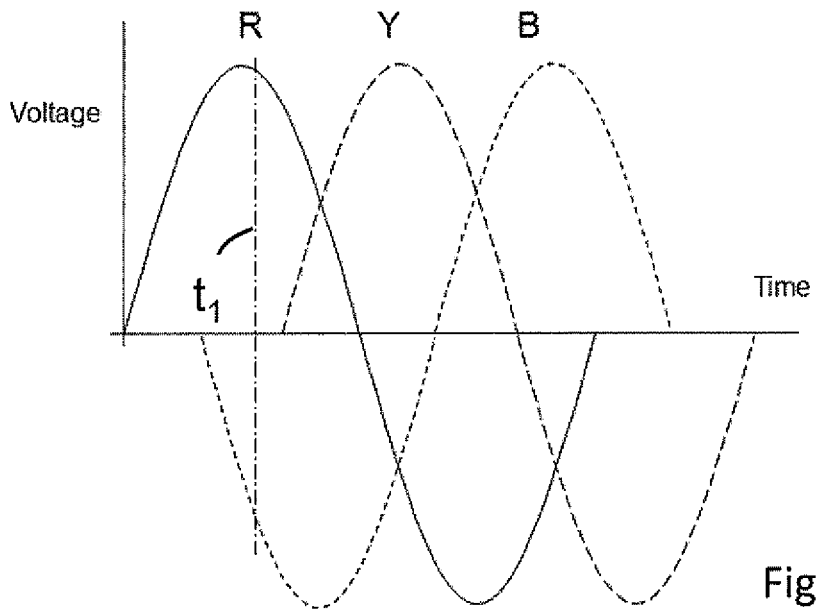

FIG. 2a shows superconducting paths 222R, 222B formed between the red phase R and positive DC rail 216p and the blue phase B and the negative DC rail 216n. This configuration corresponds to a voltage waveform shown in FIG. 2b be at time $t_1$. When a load (not shown) is connected across the DC rails at time $t_1$, current flows from the red phase connection 214R, down superconducting path 222R to the positive DC rail 216p, through the load and returns to the electrical supply via the negative D.C. rail 216n which is connected and blue phase 214B via superconductor path 222B.

Figure 3A:
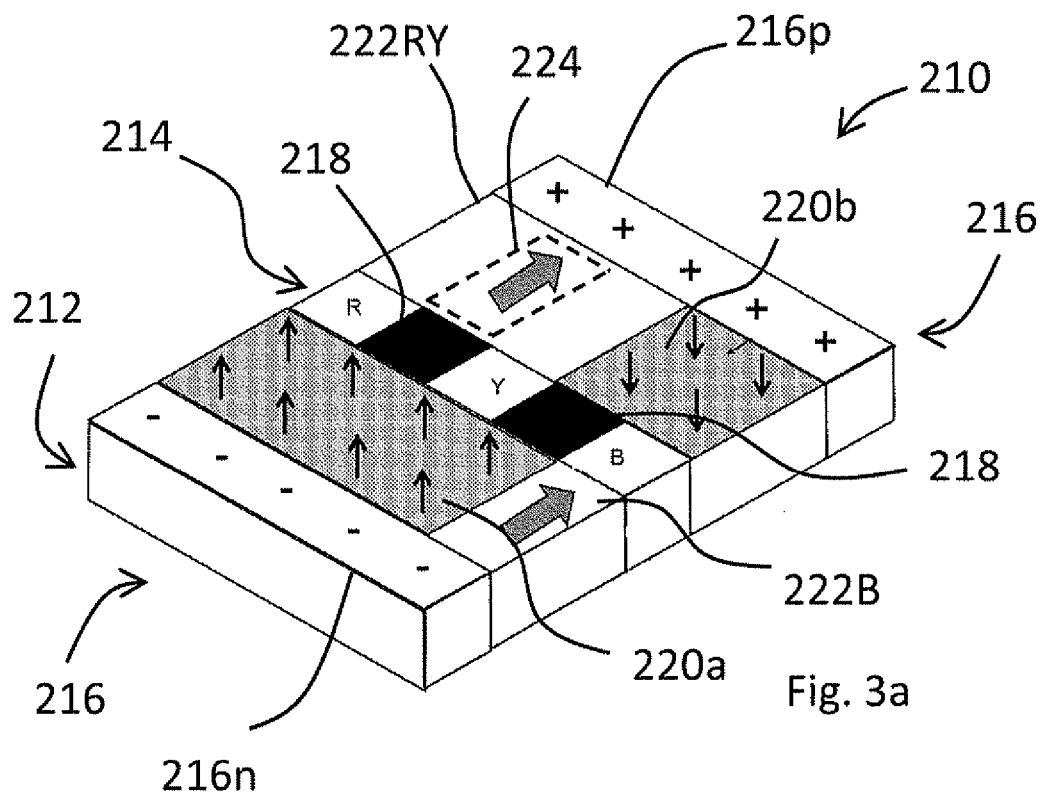
FIGS. 3a and 3b show a schematic representation of a superconducting switch arrangement of FIG. 2a and the corresponding voltage waveform at time $t_2$.
Figure 3B:
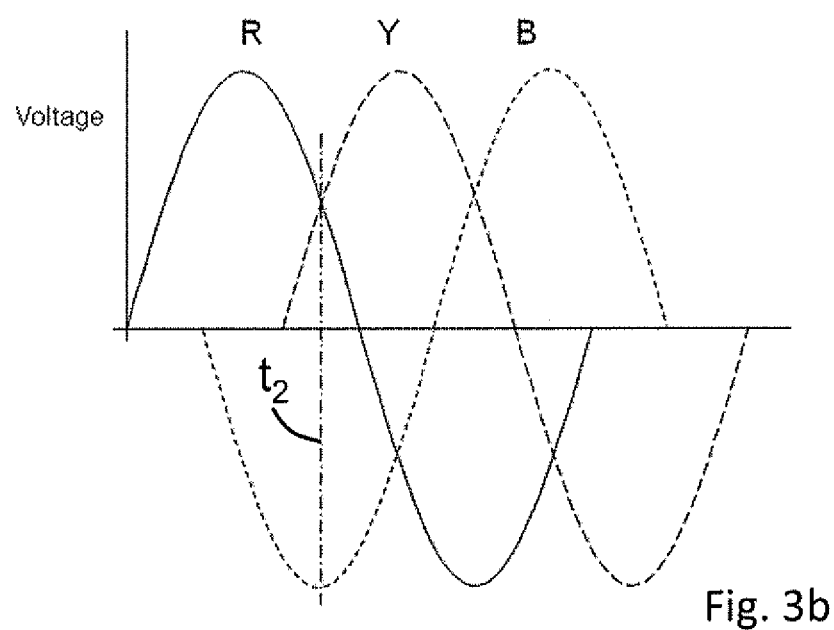
Figure 4A:
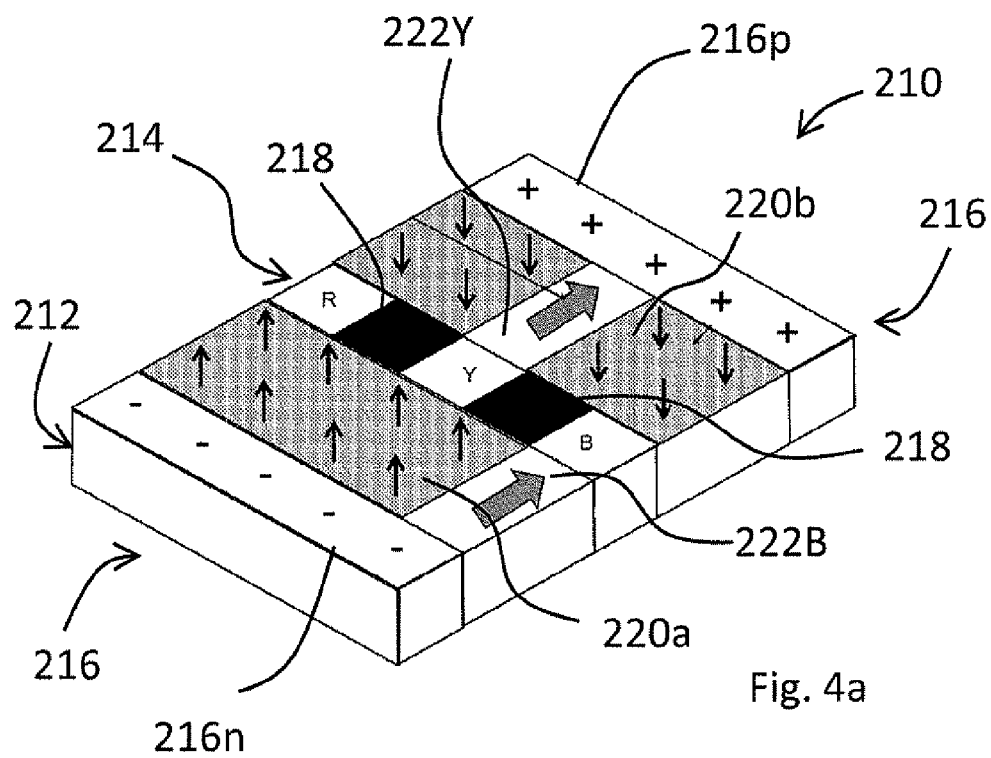
FIGS. 4a and 4b show a schematic representation of a superconducting switch arrangement of FIG. 2a and the corresponding voltage waveform at time $t_3$.
Figure 4B:
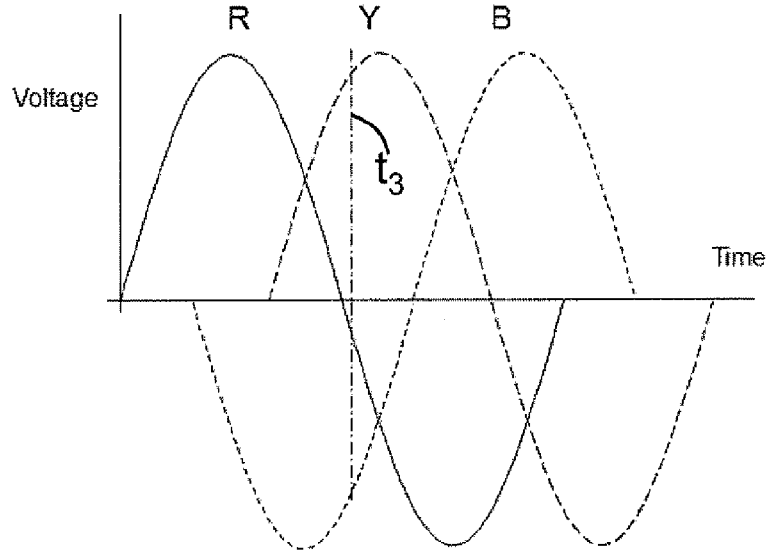

FIGS. 3a and 3b shows the same superconductor switch arrangement 310 as depicted in FIG. 2 and voltage waveform, but at time $t_2$. At time $t_2$ (as shown in FIG. 3b) the red R and yellow Y phases are equal and positive with respect to the blue phase B which is negative. Hence, the quenching device is configured to provide a superconductive path 222RY which connects both the red and yellow phase to the positive DC rail. As time progresses to $t_3$ (as shown in FIGS. 4a and 4b), the red phase becomes negative and so the superconducting path extends between the yellow phase V and positive DC rail 216p whilst the connection between the blue phase and the negative DC rail 216n is retained.

Although not shown in drawings, the switching cycle between phases R, Y, B continues as time progresses until each phase is connected in turn to the positive DC rail 216p and negative DC rail 216n in accordance with the relative polarity with each rail 216.

Switching between the phases in this way provides a superconducting path which rectifies the three phase electrical input to the superconducting switching arrangement into DC.

It will be noted that the switching between phases includes a sliding superconductive path 222 which traverses between each of the connection zones R, Y, B and which simultaneously connects adjacent phases to the DC rail 216 as it switches between phases. This configuration leads to short circuit between the phases R and Y in the region indicated by the dashed line 224 in FIG. 3a. This allows the flow of current to be maintained between the supply and DC load by being diverted from one to the other rather than discretely switching each phase on and off in turn. This sliding or diverting arrangement provides a more efficient switching from one phase to the other and largely prevents power dissipation when each section changes from a superconducting state to a resistive state. A further advantage of the sliding superconducting portions is that the reduction in resistive power reduces the time taken to re-establish superconductivity following a quench which raises the switching speed because the superconductor 212 does not require as much time to cool below its critical temperature.

Although the sliding superconductive path 222 is advantageous, careful switching is required to prevent a prolonged short circuit and large currents between the adjacent phases which would increase as the potential difference between phases increases with time t.

There are several techniques to encourage quenching to prevent large short circuit currents flowing in the shorted zone 224, either with a view to providing a protection for the device and electrical source, or to aid controlling. The first is to not switch off the applied magnetic field in that region but leave a partial applied field will in response to a predetermined short circuit current due to a voltage difference between the red and yellow phases. The second option is to make the shorted zone 224 from a superconductor of lower critical current density than the adjacent superconducting material. The third option is to operate the shorted zone at a higher temperature so that the short circuit results in a quench. The fourth option is to make the shorted zone from a thinner section of superconductor, thereby making the critical current density more easily exceeded. In essence, the above options all rely on making changes to a shorting zone so as to make the area quench under a particular current density which would flow between the phases.

FIG. 5 shows a switching arrangement similar to the one described in FIGS. 2 to 4, but which has been modified to enhance the sliding superconducting path which is necessary to prevent the rapid quenching of discrete regions of superconductor and the associated power dissipation this would cause.

In order to provide the sliding superconducting path between the red and blue phase (not shown), a further first connection zone 514BT is included adjacent to the red phase. This connection zone 514BT is a supplementary connection for the blue phase B. Hence, the connection of the blue phase is always between the two blue phase connection zones 514B, 514BT. This allows superconducting paths 522B to be formed between blue and red phases, and yellow and blue phases.

An additional electrical heating element 524 is also included on the surface of the superconductor body 512. Energising the electrical heating element 524 with a current from an electric source can assist quenching of the superconductive body 512 so as to divert the superconducting path. The wire can be made from any suitable resistive wire, for example, Nickel Chromium wire, which is insulated from the superconducting body 512 using a layer of sputtered Alumina. The wire may be fabricated in any suitable way, for example, by using an additive technique such as direct laser sintering, or an adhesive tape. It will be appreciated that the inclusion of the heating element is optional and some embodiments may not include this feature.

FIGS. 6a and 6b shows a switching arrangement 610 with a preferred embodiment of a quenching device 611 which is used to selectively provide the magnetic field (220a,b; FIGS. 2 to 4) to the superconducting switch arrangement shown in FIGS. 2 to 4. Although only one quenching device is shown 612, this is for the sake of clarity and it will be appreciated that there are two such units, one either side of the strip of first connections zones so as to provide the magnetic fields 220a,b shown in FIGS. 2 to 4 and here in FIG. 6 as 620a,b. Hence, the second quenching device which is not shown is arranged in a similar fashion to the one described below, but over the positive rail half of the device to control the superconductive paths which connect the phases and positive D.C. rail 616p.

The quenching device 611 is in the form of a closed magnetic circuit 624 which surrounds the superconducting body 612. The magnetic circuit 624 is rectangular in cross section and comprises two magnetic flux sources in the form of magnetically polarised members 626a, 626b arranged in parallel, one along each of the short sides of the magnetic circuit 624, either side of the superconducting body 612. The polarised members 626a,b are connected at each end with two corresponding parallel high permeability members 628a,b which extend between and connect to the corresponding pole North and South poles of the magnetically polarised members, along the long sides of the rectangular magnetic circuit 624. The arrangement of the magnetic circuit 624 is such that a magnetic field is presented perpendicular to the superconducting body 612 and the currents which flow in the superconducting paths 622B, 622Y.

The magnetically polarised members 626a,b may be permanently magnetised, electromagnets or superconductors which are magnetised using known methods of flux pumping techniques.

The quenching device 611 includes a plurality of coils 630 (of which only two are shown) are arranged in series between the magnetic flux sources on the proximal faces of the connecting members. The coils 630 are spaced and sized such that, when selectively energised, they can produce a magnetic field which opposes the magnetic field of the magnetic flux sources, thereby altering the magnetic field 620a which is presented to the surface of the superconducting body 612. In this way, the magnetic field 620a seen by the superconducting body 612, and hence the quenching, can be controlled to specific areas. Hence, as can be seen in FIG. 6b, a portion of superconducting material which forms a superconducting path 622B can be set up to allow the conduction pattern as described above. Altering the energised configuration of the coils 630 allows the superconducting path 622B to be swept across the superconducting body 612.

In another embodiment, the coils are placed within the high permeability members. Alternatively, the coils are placed in slots according to known techniques of manufacturing electrical windings.

As described above, it is possible for the described device to be used as a rectifier in which the first connections zones are connected to an alternating current supplied and the second connection zones are connected to a direct current load. However, the device can also be used to convert DC to AC simply by reversing the connections of the supply and load in the process described above.

It will also be readily apparent to the skilled person, that the switching arrangements described above can be connected to another similar switching arrangement in a back to back configuration in which the second connection zones are connected together to provide a DC link. Hence, it is possible to create a power converter (or inverter) which comprises two of the superconducting switching arrangements which converts an input having a first AC frequency to an output having a second AC frequency.

Although the above embodiments are described with reference to a three-phase electrical circuit, the invention can also be applied to any number of phases. Alternatively, the input has a first number of phases and the output has a second number of phases.

Figure 7:
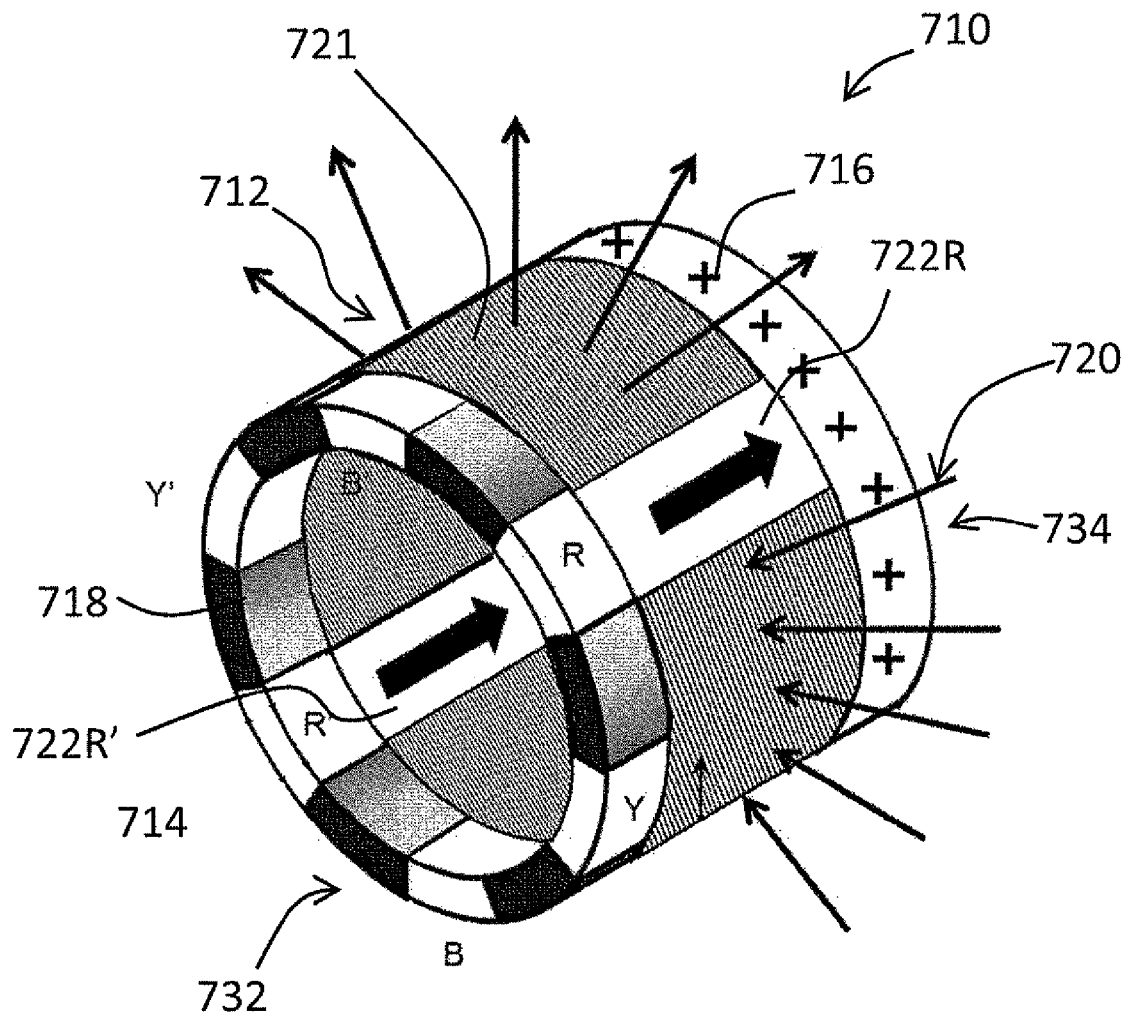
FIG. 7 shows a cylindrical superconductor switching arrangement.

FIG. 7 shows an alternative embodiment of the switching arrangement 710 in which the superconducting body 712 is cylindrical. Thus, there is shown a hollow cylindrical superconducting body 712 having a first end 732 and a second end 734. The first end 732 includes a plurality of first connections zones 714 which are electrically coupled to a three-phase electrical supply and electrically isolated from one another with electrical insulation 718 in the form of alumina. The second end 734 of the superconducting body 712 includes the second connection zone 716 in the form of a positive DC connection.

The axially extending portions between the first 732 and second 734 ends are a superconducting material. As with the previous embodiments, a quenching device 711 provides a perpendicular, in this case radial, magnetic field 720 to quench regions 721 of superconductor and define superconducting paths 722R, R'. The superconducting paths 722 R, R' link the RYB phases and the DC connection using a sliding superconducting path as described for the embodiments of FIGS. 2 to 4. The switching arrangement 710 is such that each phase is connected to a pair of connection zones such that a rotating magnetic dipole (described in more detail below with reference to FIGS. 8a and b) can be used for the quenching device. Thus, each of the phases has two superconducting paths 722R, R' connecting to the positive DC rail.

Figure 8A:
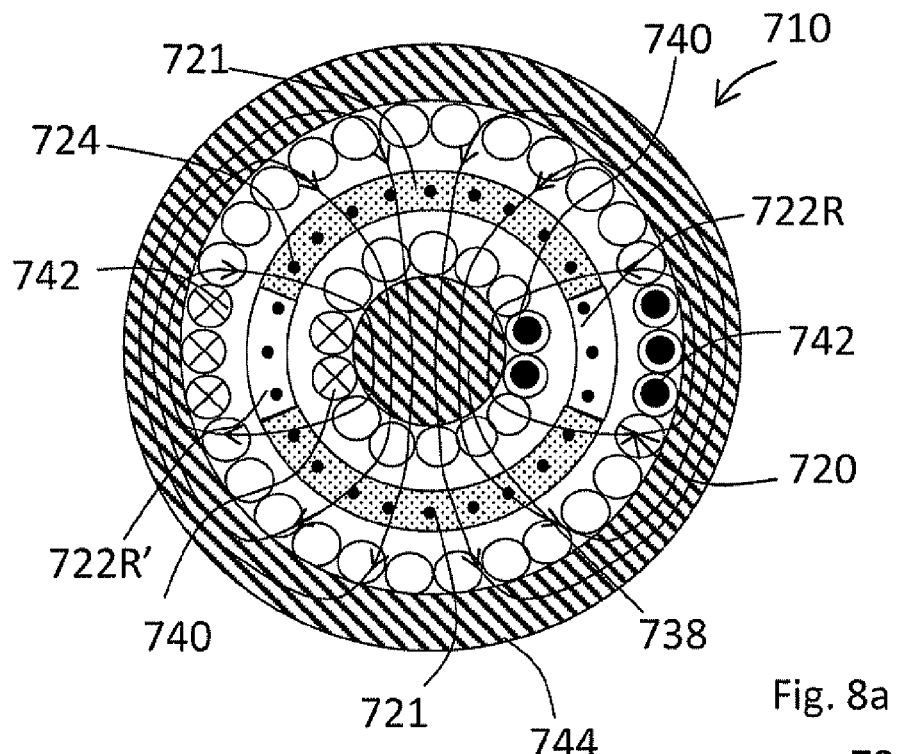
FIGS. 8a and 8b show, respectively, radial and axial cross sectional views of the superconductor switching arrangement of FIG. 6.
Figure 8B:
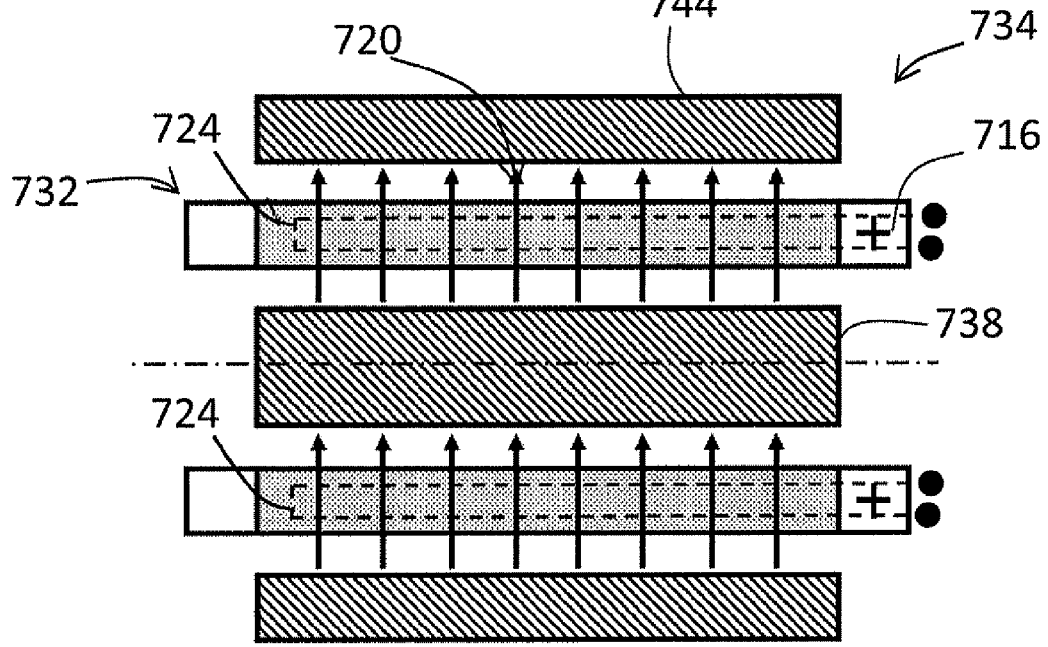

FIGS. 8a and 8b show radial and axial cross-sectional views of the cylindrical switching arrangement 710. Thus, there is shown in radial series, a cylindrical inner magnetic core 738 having a longitudinal axis, a first coil 740 (not shown in FIG. 8b for the sake of clarity), the cylindrical superconducting body 721 which is coaxial with the inner magnetic core 738, a second coil 742 and an outer magnetic core 744. In this embodiment, the inner magnetic core 738, and first 740 and second 742 coils, and outer magnetic core 744 provide the quenching device. The coils 740, 742 can be energised to provide a magnetic dipole having flux lines which extend radially through the superconducting body where required to provide the quenched regions 721 and superconducting paths 722. The coils 740, 742 can be any suitable configuration which will allow the set up of the radial magnetic field 720. However, having a polyphase winding which can provide a rotating magnetic field, as is known in the art, in, for example, induction machines, allows the superconducting path to be rotated about the superconducting body such that the switching function as described above for the embodiments shown in FIGS. 2 to 4 can be provided simply by rotating the field circumferentially around the body.

As will be noted, the cylindrical switching device provides rectification only with respect to one DC connection. Thus, it will be appreciated that two of the cylindrical switching arrangements are needed to provide a full rectifier.

An additional electrical heating element 724 may also be included within the superconductor body 712. Energising the electrical heating element 724 with a current from an electric source can assist quenching of the superconductive body 712 so as to divert the superconducting path. The heating element can be made from any suitable resistive wire, for example, nickel-chromium wire, which is insulated from the superconducting body 712 using a suitable dielectric, for example, a poly vinyl chloride coating.

The wire may be buried within the superconducting body prior to the sintering process used to fabricate the body (in which case the insulation would have to withstand the associated pressure), or alternatively passageways may be bored through the superconducting body and the resistive wire subsequently fed through and connected to an electrical supply.

It will be appreciated that a surface mounted resistive wire may also be used to provide the heating elements as described in the other embodiments.

Figure 9A:
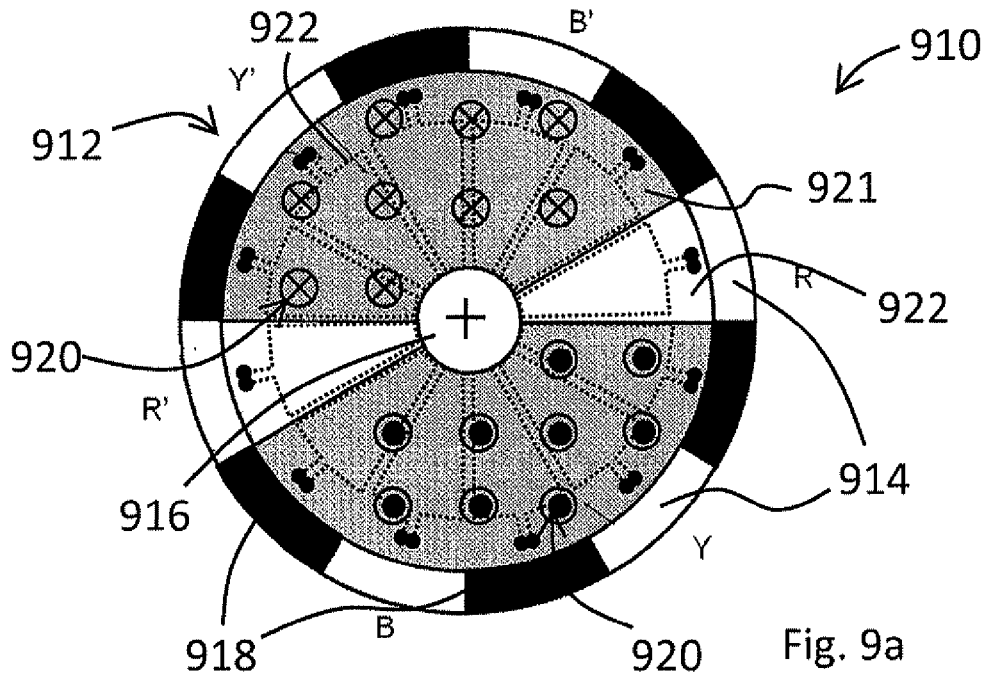
FIGS. 9a-9c show plan and cross sectional views of a pancake superconductor switching arrangement.
Figure 9B:
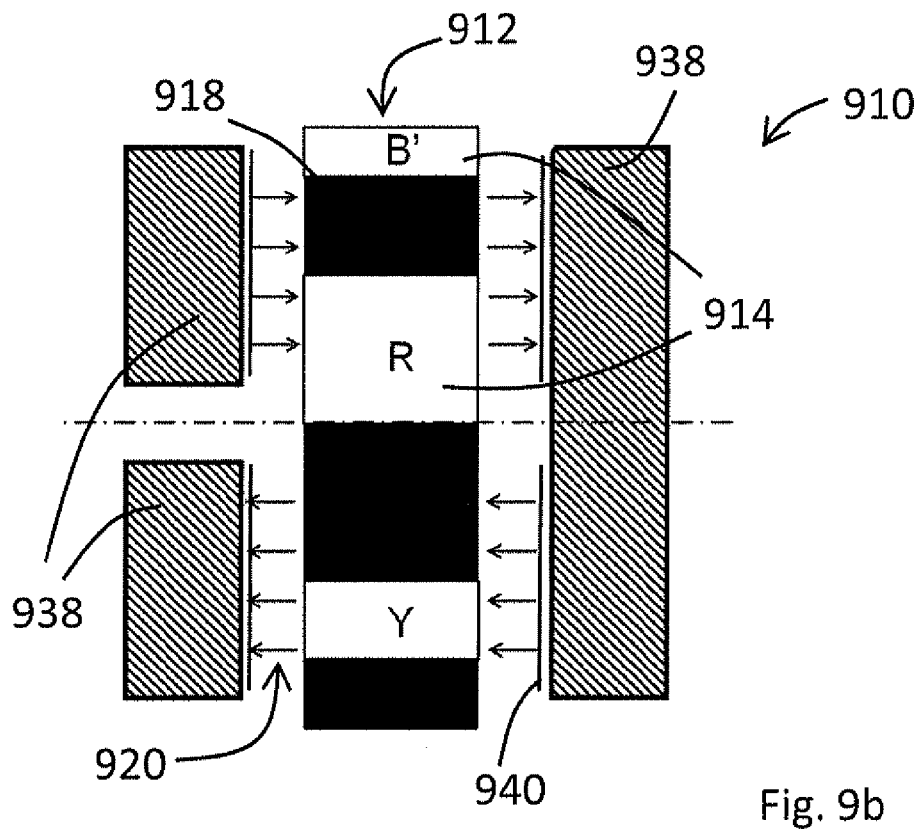
Figure 9C:
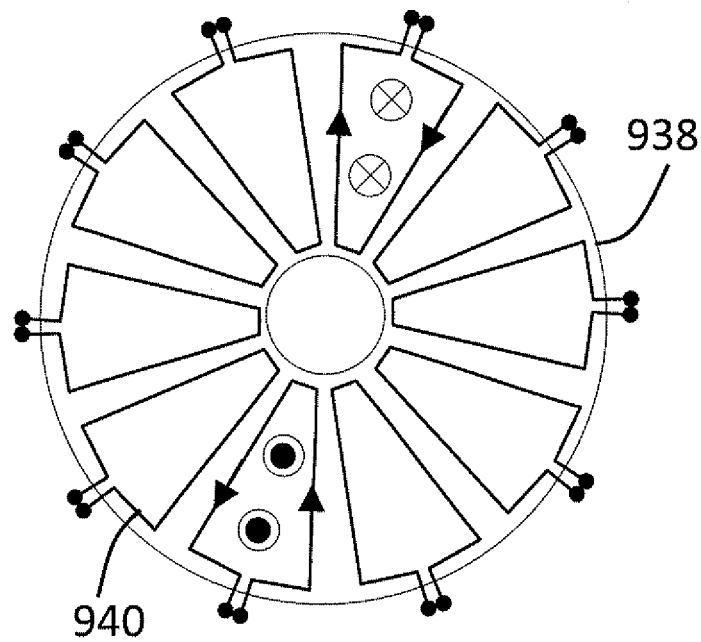

In another embodiment of the switching arrangement 910, the superconducting body 912 is in the form of a monolithic homogeneous disc, as shown in FIGS. 9a, 9b and 9c. Here, the first connection zones 914 are provided on the periphery of the disc 912 and the DC connection is provided at the second connection zone 916 at the central region of the disc.

As with the previously described embodiments, the quenching device 938 includes a plurality of coils 940 as illustrated in FIG. 9c which provide the superconducting body 912 with a perpendicular magnetic field 920, axial in this case, to provide the quenched regions 921 and superconducting paths 922. These regions 921 and paths 922 can be circumferentially moved around the disc by selectively energising the coils 940 so as to connect each of the first connection zones 914 to the second connection zone 916 in turn. The quenching device 938 and coils 940 can be made in accordance with a known design of winding termed a "disc" or "pancake" winding. As with the cylindrical embodiment, it will be appreciated that two such devices are required to provide a rectifier. Nevertheless, the switching arrangement 910 may be employed in other applications without a second device where suitable.

In one embodiment, the two halves of the quenching device 938 are held together by clamps, struts or spacers (not shown). In order to aid setting up the quenching magnetic fields, the clamps, struts or spacers I on either side of the superconducting body may be made of laminated material of high magnetic permeability in order to provide a more efficient magnetic circuit.

An additional electrical heating element 922 may also be included on the surface of the superconductor body 912. Energising the electrical heating element 924 with a current from an electric source can assist quenching of the superconductive body 912 so as to divert the superconducting path. The wire can be made from any suitable resistive wire, for example, nickel- chromium wire, which is insulated from the superconducting body 912 using a layer of sputtered Alumina. The wire may be fabricated in any suitable way, for example, by using an additive technique such as direct laser sintering, or an adhesive tape. It will be appreciated that the inclusion of the heating element is optional and some embodiments may not include this feature. Further, the pattern of the conductor may be altered to suit the quenching pattern required.

Figure 10:
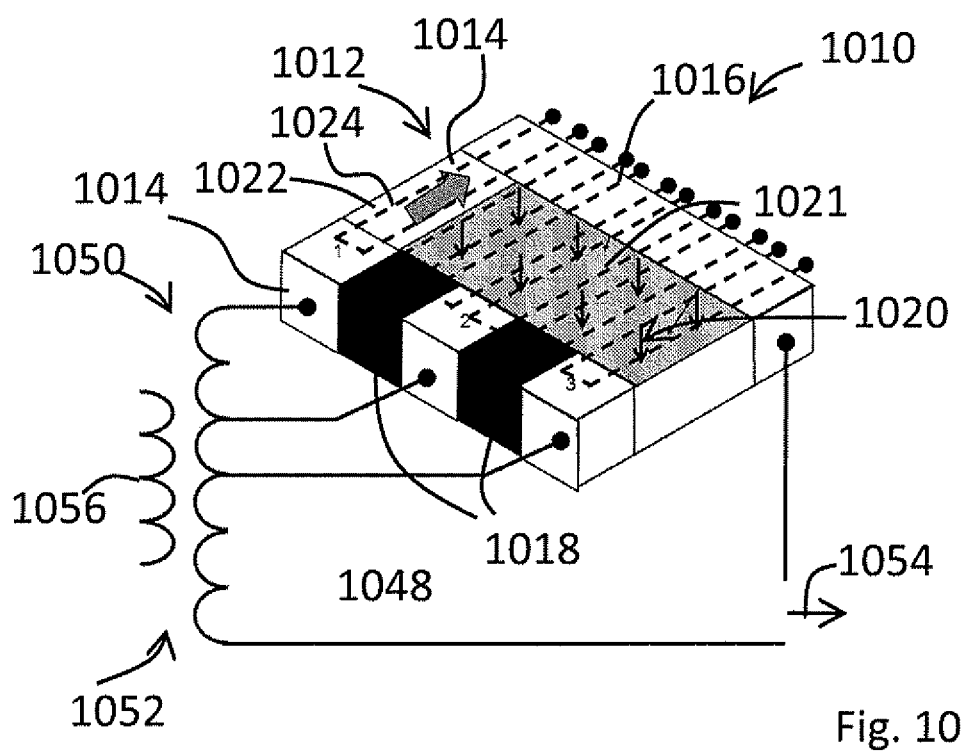
FIG. 10 shows a transformer arrangement which includes a superconductor switching arrangement.

In yet a further embodiment, the superconducting switching arrangement 1010 is used to provide a tapped transformer, as shown in FIG. 10. The transformer has a superconductor body 1012 in the form of a rectangular plate-like monolith of homogenous superconductor material, a plurality of first connection zones 1014 R, Y, B and a second connection zone 1016.

The properties of the superconductor 1012 are not restrictive and can be any known type which is suitable as per requirements of the described embodiments. For example, the superconductor may be bismuth strontium calcium copper oxide (BSCCO), yttrium barium copper oxide (YBCO) or magnesium diboride ($MgB_2$). As will be appreciated, these materials need to be provided with the environment to achieve a superconducting state. For example, the device may be placed within a cryostat with adequate cooling and thermal insulation etc. The cryostat and thermal insulation is not shown for the sake of clarity. Further, some applications will require the superconducting switching arrangement to be electrically, magnetically and thermally shielded.

The plurality of first connection zones 1014 includes three separate connection points provided in a linear arrangement along one edge of the superconducting body 1012. The first connection zones 1014 extend across the entirety of the superconducting body 1012 with a connection zone provided at corresponding positions on opposing corners of the edge.

Each of the first connection zones is separated from the adjacent zone via a dielectric barrier in the form of a block of electrical insulation 1018 which abuts the connection zones on either side. The electrical insulation 1018 may be any known type which could be incorporated into the superconducting body 1012.

The first connection zones 1014[1], 1014[2], 1014[3] are connected to different points along the length of a transformer winding 1048. For the sake of explanation, the winding 1048 can be considered to be the secondary winding. The [1]first connection zone 1014 is connected at a first end 1050 of the winding 1048, the [2] first connection zone 1014 is connected approximately a third of the way along the winding and the [3] first connection zone 1014 is connected approximately half way along the winding 1048. By along the winding 1048, it will be appreciated that this is reference to the length of the winding 1048 in terms of turns, rather than physical location, although these points may coincide.

The second end 1052 of the secondary winding 1048 is connected to an electrical network or load (not shown) as indicated by arrow 1054. The other electrical network or load connection is made through the second connection zone 1016. Thus, when a superconductive path 1022 is formed in the superconducting body 1012 between one of the first connection zones 1014[1] and the second connection zone 1016, a closed electrical circuit is formed.

The other winding of the transformer 1010, the primary winding 1056, is connected to an electrical source (not shown).

A magnetic field 1020 is provided perpendicular to the plane the rectangular superconductor body 1012 by a quenching device (not shown but as described with reference to FIGS. 5a and 5b above) which is operable to create a magnetic field 1020 of sufficient strength and distribution to selectively quench regions 1021 of the superconductor body 1012. Hence, in this way, portions of the superconductor body 1012 can be quenched and returned to a high resistive state, thereby removing the superconducting path 1022. Thus, it is possible to isolate between the different connection zones as per a required configuration.

An additional electrical heating element 1024 is also included on the surface of the superconductor body 1012. Energising the electrical heating element 1024 with a current from an electric source can assist quenching of the superconductive body 1012 so as to divert the superconducting path. The wire can be made from any suitable resistive wire, for example, nickel-chromium wire, which is insulated from the superconducting body 1012 using a layer of sputtered alumina. The wire may be fabricated in any suitable way, for example, by using an additive technique such as direct laser sintering, or an adhesive tape. It will be appreciated that the inclusion of the heating element is optional and some embodiments may not include this feature.

The switch arrangement 1010 is shown in an operational state with a superconductive path 1022 being provided from the first connection zone 1014[1] to the second connection zone 1016. In this configuration the transformer ratio between the primary 1056 and secondary 1048 windings is 4:6 (as shown in FIG. 10) and so represents a step up transformer. Providing the superconducting path 1022 between the first connection zone 1014[2] and the second connection results in a 1:1 transformer, and for having the superconducting path 1022 between the first connection zone 1014[3] and the second connection results in a 4:3 step down transformer. Thus, the ratio of the windings can be adjusted as required.

It will be appreciated that the ratio of the windings can be chosen as required for a particular application and the load and source may be interchanged.

In yet a further embodiment, there is provided a changeover switch in which a single input is switched between a choice of outputs. This would operate in a similar way to the tapped transformer, except that the switching arrangement would be line connected with each of the first connection zones being connected to a load, and the second connection zone being connected to a supply terminal of an electrical source. In this way, switching the superconductive path between first connection zones would switch the electrical circuit between one load and another.

Figure 11:
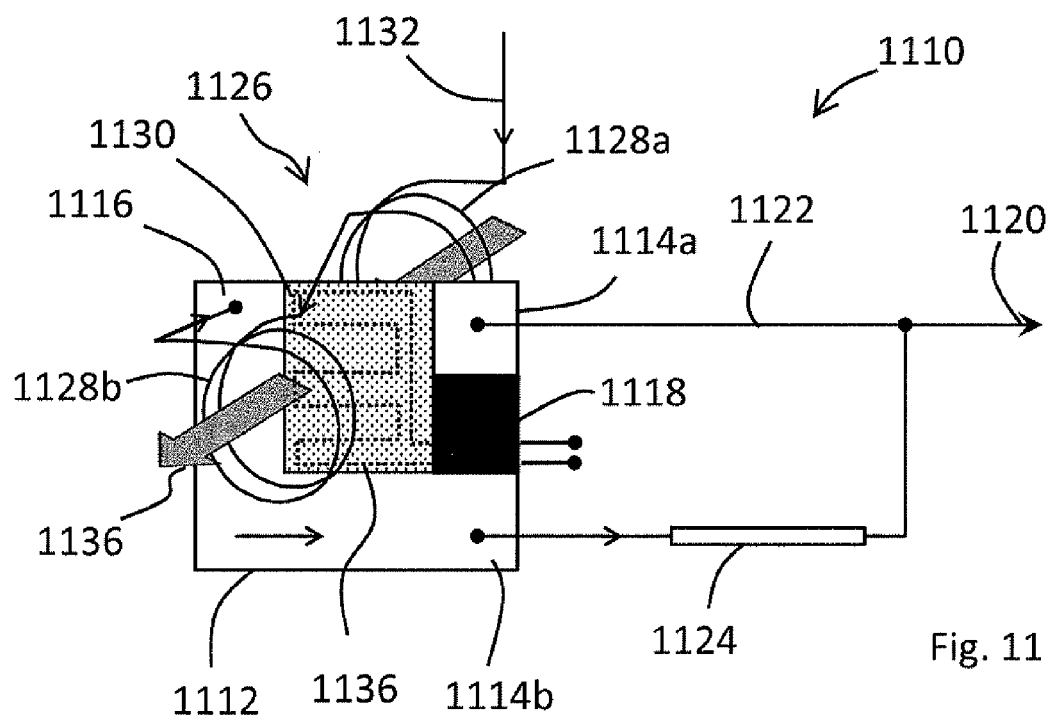
FIG. 11 show an exemplary embodiment of a superconductor switching arrangement in the form a fault current limiter.

FIG. 11 shows yet another embodiment where there is provided a switching arrangement 1110 in the form of a fault current limiter in which a single input is switched between a choice of outputs so as to limit current in an external circuit (not shown). The switching arrangement 1110 includes a superconducting body 1112 in the form of a rectangular plate-like monolith of homogenous superconductor material having first connection zones 1114 and a second connection zone 1116. The second connection zone 1116 is connected to an electrical source (via a quenching device, as described below). There are two first connection zones 1114a, 1114b, each connected to a common load 1120 but with one connection via a low impedance line 1122 and the other through a high impedance line 1124. The two first connection zones 1114a, 1114b are arranged along one side of the superconducting body 1112 and are separated by an electrical insulator 1118.

The quenching device 1126 is in the form of a solenoid 1128 which has two serially connected coils 1128a, 1128b arranged coaxially either side of the superconducting body 1112 so as to create a quenched zone 1130 between the first connection zones 1114a, 1114b and the low impedance line output 1122, when energised. One end of the solenoid 1128 is connected to an electrical source 1132 (not shown) with the other connected to the second connection zone 1116.

An additional electrical heating element 1136 is also included on the surface of the superconductor body 1112. Energising the electrical heating element 1136 with a current from an electric source can assist quenching of the superconductive body 1112 so as to divert the superconducting path. The wire can be made from any suitable resistive wire, for example, nickel-chromium wire, which is insulated from the superconducting body 1112 using a layer of sputtered alumina. The wire may be fabricated in any suitable way, for example, by using an additive technique such as direct laser sintering, or an adhesive tape. It will be appreciated that the inclusion of the heating element is optional and some embodiments may not include this feature.

During normal operation, the solenoid is connected to an electrical supply such that a current below a predetermined level (the rated current) flows through the first and second coils to the second connection zone, through a superconducting path between the second and first connection zones, and to the load via the low impedance path. The rated current of the device is that which creates a magnetic field which is small enough not to quench the superconducting path.

If a fault occurs in the electrical network downstream of the fault current limiter, the current rises and a larger magnetic field 1134 is set up between the two coils of the solenoid 1128. The resulting magnetic field causes the superconducting path to quench 1130 and the load current to pass into the load via the high impedance path 1124. In this way, the current flowing through the circuit is limited. This configuration is shown in FIG. 11.

Figure 12:
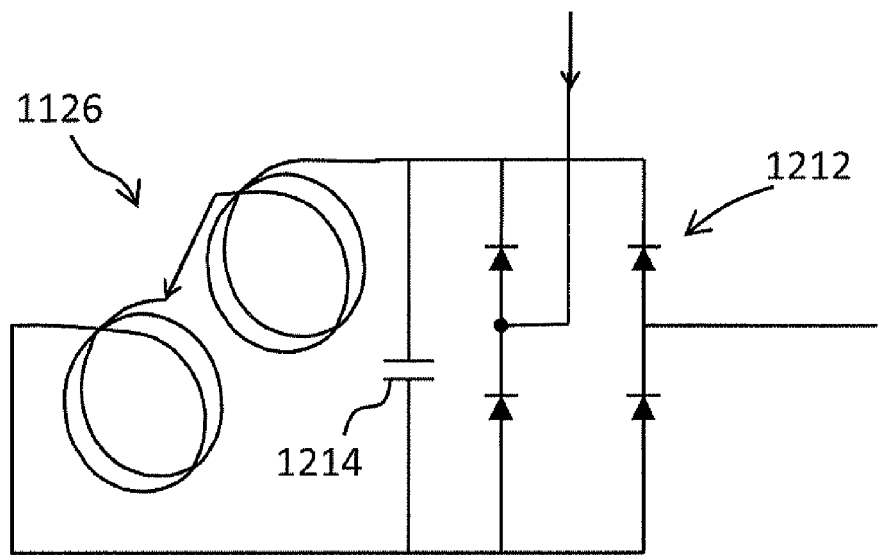
FIG. 12 show an exemplary embodiment of the quenching device of FIG. 11.

If the external circuit is an AC circuit then the current in the solenoid 1128 will be AC and this will apply an alternating magnetic field to the superconducting body 1112, resulting in AC losses in the superconductor 1112. To help improve the efficiency in the circuit, AC losses can be reduced by rectifying the AC in the external circuit to produce DC and using this to supply the solenoid, Hence, in FIG. 12 there is shown an embodiment of the quenching device 1126 shown in FIG. 11 which includes a full wave diode rectifier 1212 and filter in the form of a capacitor 1214 which are connected to the solenoid so as to rectify the AC supply for the solenoid.

In another embodiment, the current in the solenoid can be controlled by an electrical protection circuit that detects when an electrical limit is exceeded and passes current through the solenoid.

In some embodiments, it may be preferable to locate the solenoid outside the cryostat that contains the superconducting body 1112 to help retain the thermal integrity of the cryostat, thereby increasing the efficiency of the arrangement. The rectifier and the filtering circuit may also be outside the cryostat.

In other embodiments, the superconducting body may include passageways in which heat transfer fluid can flow. The passageways may include valves or switches to redirect a flow of fluid, thereby allowing the portions of the superconducting body to heat up and quench or to cool down and restore superconductivity, depending on the temperature of the heat transfer fluid and its pattern of flow.

The embodiments described above are mere examples of the invention as defined by the claims and should not be seen as limiting the scope of the claims.

The invention claimed is:

1. A superconductor switching arrangement, comprising:
a superconductor having a plurality of first connection zones and at least one second connection zone, the first and second connection zones being connectable by at least one superconducting path in use and in which the at least one second connection zone is selectively connectable to each of the plurality of first connection zones; and
a quenching device which is operable to selectively quench portions of the superconductor so as to remove the superconducting path between at least one of the first connection zones and the at least one second connection zone.

2. A superconductor switching arrangement as claimed in claim 1 wherein the quenching device includes at least one magnetic flux source configured to provide a critical magnetic field to the superconductor.

3. A superconductor switching arrangement as claimed in claim 1 wherein the quenching device further comprises at least one electromagnetic coil which is switchable to modify the magnetic field provided to the superconductor in use.

4. A superconductor switching arrangement as claimed in claim 1 wherein the quenching device is configurable to provide a superconductive path between two adjacent first connection zones and a second connection zone.

5. A superconductor switching arrangement as claimed in claim 3 wherein the electromagnetic coil includes a superconductor.

6. A superconductor switching arrangement as claimed in claim 1 wherein the quenching device is configurable to provide a superconducting path between at least two of the plurality of first connection zones.

7. A superconductor switching arrangement as claimed in claim 1 wherein the superconductor is a monolithic homogeneous body.

8. A superconductor switching arrangement as claimed in claim 1 further comprising dielectric barriers between each of the plurality of first connection zones.

9. A superconductor switching arrangement as claimed in claim 1 wherein the body is cylindrical.

10. A superconductor switching arrangement as claimed in claim 1 wherein the quenching device is configured to provide a radial magnetic field.

11. A superconductor switching arrangement as claimed in claim 1 wherein the quenching device is configured to provide an axial magnetic field.

12. A superconductor switching arrangement as claimed in claim 1 wherein the quenching device includes at least one poly phase winding which is configured to provide rotating magnetic field in use.

13. A superconductor switching arrangement as claimed in claim 1 having at least two second connection zones connected to a direct current electrical load or source.

14. A superconductor switching arrangement as claimed in claim 1 having at least three first connection zones, each of the first connection zones being connected to a single phase of a three phase alternating current electrical circuit.

15. A superconductor switching arrangement as claimed in claim 14 wherein at least one of the single phases is connected to at least two of the first connection zones.

16. A superconductor switching arrangement as claimed in claim 1 further comprising a heater for selectively heating portions of the superconductor body.

17. A superconductor switching arrangement as claimed in claim 1 further comprising a network of passageways within the superconducting body, wherein the network of passageways is configurable such that a flow of fluid can be selectively controlled so as to quench or cool portions of the superconducting body.

18. A power convertor having a plurality of superconductor switching arrangements as claimed in claim 1.

19. A superconductor switching arrangement as claimed in claim 1 further comprising a transformer winding, wherein each of the plurality of first connection zones connects to a different electrical portion of the winding.

20. A method of switching between electrical connection zones of a superconductor switching arrangement which comprises:

a superconductor having a plurality of first connection zones and at least one second connection zone, the first and second zones being connectable by a superconducting path in use, a quenching device which is operable to selectively quench portions of the superconductor so as to remove the superconducting path between at least one of the first connection zones and the at least one second connection zone, the method comprising the steps of:

connecting at least one first electrical circuit to the plurality of first connection zones;

connecting at least one second electrical circuit to the at least one second connection zone;

putting the superconductor into a superconducting state;

quenching a first region of the superconductor with the quenching device so as to quench regions of the superconducting device and provide a superconducting path between a first one of the at least one of the first connection zones and the at least one second connection zone; and quenching a second region of the semiconductor with the quenching device so as to quench regions of the superconducting device and provide a superconducting path between a second one of the at least one first connection zones and the at least one second connection zone.

* * * * *